US010742214B2

(12) United States Patent
Lukas (10) Patent No.: US 10,742,214 B2
(45) Date of Patent: Aug. 11, 2020

(54) MANUAL OPERATING ELEMENT, CONTROL SYSTEM, PIECE OF FURNITURE AND METHOD FOR OPERATING AN ELECTRICALLY ADJUSTABLE PIECE OF FURNITURE

(71) Applicant: LOGICDATA Electronic & Software Entwicklungs GmbH, Deutschlandsberg (AT)

(72) Inventor: Stefan Lukas, Preding (AT)

(73) Assignee: LOGICDATA ELECTRONIC & SOFTWARE ENTWICKLUNGS GMBH, Deutschlandsberg (AT)

( * ) Notice: Subject to any disclaimer, the term of this patent is extended or adjusted under 35 U.S.C. 154(b) by 28 days.

(21) Appl. No.: 16/226,456

(22) Filed: Dec. 19, 2018

(65) Prior Publication Data

US 2019/0199349 A1    Jun. 27, 2019

(30) Foreign Application Priority Data

Dec. 22, 2017    (DE) ........................ 10 2017 131 081

(51) Int. Cl.
*H03K 17/965*    (2006.01)
*H03K 17/96*    (2006.01)
(Continued)

(52) U.S. Cl.
CPC ........... *H03K 17/965* (2013.01); *F16M 11/18* (2013.01); *H03K 17/962* (2013.01);
(Continued)

(58) Field of Classification Search
CPC ............... H03K 17/965; H03K 17/962; H03K 2217/960705; F16M 11/18; A47B 9/00;
(Continued)

(56) References Cited

U.S. PATENT DOCUMENTS 8,553,842 B2    10/2013    Moon et al.
9,289,057 B2    3/2016    Dienes et al.
(Continued)

FOREIGN PATENT DOCUMENTS

DE    102009022471 A1    12/2010
DE    202014005160 U1    8/2014
(Continued)

*Primary Examiner* — Robert L Deberadinis
(74) *Attorney, Agent, or Firm* — Morgan, Lewis & Bockius LLP (57) ABSTRACT

A manual operating element for operating an electrically adjustable piece of furniture includes a handle body comprising a mounting body, a handle section connected to the mounting body and an elastic member operatively connected to the handle section. The mounting body is adapted to be attached to a component of the piece of furniture. The handle section is adapted for gripping by a user. A force sensor is operatively connected to the elastic member and serves to detect a directional force value corresponding to a force applied to the handle section. A touch sensor is used to detect a touch value as a function of the user touching the handle section. A communication unit is arranged to transmit the force value and the touch value or a signal derived from the force value and the touch value to a controller of the piece of furniture.

29 Claims, 7 Drawing Sheets (51) Int. Cl.
*F16M 11/18* (2006.01)
*H02P 29/00* (2016.01)
*A47B 9/00* (2006.01)

(52) U.S. Cl.
CPC ............ *H03K 17/9625* (2013.01); *A47B 9/00* (2013.01); *A47B 2200/0056* (2013.01); *A47B 2200/0062* (2013.01); *H02P 29/00* (2013.01); *H03K 2217/960705* (2013.01)

(58) Field of Classification Search
CPC .... A47B 2200/0056; A47B 2200/0062; H02P 29/00
See application file for complete search history.

(56) References Cited

U.S. PATENT DOCUMENTS

| | | |
|---|---|---|
| 9,955,780 B2 | 5/2018 | Koch |
| 2016/0229312 A1 | 8/2016 | Entenmann et al. |

FOREIGN PATENT DOCUMENTS

| | | |
|---|---|---|
| DE | 102013107053 A1 | 10/2014 |
| DE | 102014009150 A1 | 1/2016 |
| DE | 102014221265 A1 | 4/2016 |
| DE | 102015014878 A1 | 5/2017 |
| WO | 2014076095 A1 | 5/2014 |
| WO | 2016012277 A1 | 1/2016 |

MANUAL OPERATING ELEMENT, CONTROL SYSTEM, PIECE OF FURNITURE AND METHOD FOR OPERATING AN ELECTRICALLY ADJUSTABLE PIECE OF FURNITURE

BACKGROUND OF THE INVENTION

The present disclosure relates to a manual operating element for operating an electrically adjustable piece of furniture, to a control system with such manual operating element, to a piece of furniture with such a control system and to a method for operating an electrically adjustable piece of furniture.

Adjustable furniture is well known in both office and home furnishings. The most common designs in the office furniture sector are, for example, electrically adjustable tables or chairs, while electrically adjustable beds, seating furniture or loungers are known in the home sector.

To operate such adjustable furniture, an operating element is required in each case, via which a user of the piece of furniture can initiate a desired adjustment process. For this purpose, a kind of control panel is usually used, which has one, two or more control panels or control buttons, via which an adjustment is triggered. Such conventional operating elements, however, lack intuitive operation with the exception of basic functions. In addition, it is difficult to integrate the conventional operating elements into the overall appearance of the adjustable piece of furniture.

SUMMARY OF THE INVENTION

The present disclosure provides an improved operating concept which, among other things, enables intuitive operation of an electrically adjustable piece of furniture.

The improved operating concept is based on the idea of providing a preferably lever-like manual operating element that can be attached to a component of a piece of furniture and includes at least a force sensor and a touch sensor. The force sensor can be used to detect a force acting on the manual operating element, in particular the magnitude of the force and a direction of the force, for example to effect force-dependent control of the piece of furniture. The touch sensor can be used to detect a touch of the manual operating element by a user, for example to prevent unintentional adjustment of the piece of furniture in the event of force exerted by the user unintentionally or unintentionally.

The manual operating element, for example, comprises a handle body on which the force sensor can detect an impact. The handle body has various functional components, in particular a mounting body, a handle member or handle section connected to the mounting body and an elastic member operatively connected to the handle member or handle section. These functional components can be individual parts in various designs, which are joined together to form the handle body. Alternatively, the handle body can also be designed as a single piece, so that the various functional components are created, for example, by appropriate machining, in particular mechanical machining of a basic body. Preferably, the manual operating element is not part of the furniture to be adjusted but is fixed to a part of the furniture with the mounting body.

In an example implementation of the improved operating concept, a manual operating element for operating an electrically adjustable piece of furniture comprises the handle body, which comprises a mounting body, a handle section connected to the mounting body and an elastic member operatively connected to the handle section. The mounting body is designed to be attached to a component of the furniture. The handle section is designed for gripping by a user. The manual operating element further comprises a force sensor for detecting a directional force value corresponding to a force applied to the handle section, the force sensor being operatively connected to the elastic member. A touch sensor on the manual operating element is used to detect a touch value as a function of the user touching the handle section. A communication unit is arranged to transmit the force value and the touch value and/or a signal derived from the force value and the touch value to a controller of the piece of furniture.

Preferably by touching or moving the handle section, a force is exerted on the arrangement during intended operation of the manual operating element. This force leads to a measurable deformation of the elastic member, whereby the measurement is carried out via the force sensor, which is operatively connected to the elastic member. The operative connection between the handle section and the elastic member allows the force to be transmitted from the handle section to the force sensor via the elastic member.

The elastic member can be made of metal or plastic, for example. Preferably, the elastic member has a rest position into which it returns when the user does not exert any force. This rest position is achieved either by the elasticity of the member itself or by a restoring element such as a spring. For example, the elastic member itself can be a metal spring. In various forms, the elastic member may be enveloped by another material. For example, a metal leaf spring may be contained in a recess in the handle section. For example, a deformable but not elastic, or at least not sufficiently elastic, element may be surrounded by another elastic material, with the elastic material of the shell serving as a restoring element. Bending the elastic shell also deforms the element it contains, such as a plastic-coated metal foil. The elastic member may, for example, also be a rod made of metal or other solid material, which is made deformable by a user by drilling and/or milling.

In various implementations, the touch sensor comprises at least one of the following: a capacitive sensor, a microswitch, a piezo switch, a sensor based on active materials, in particular active polymers, this enumeration not being intended to be exhaustive.

In one implementation, the touch sensor comprises a capacitive sensor, wherein the handle section and/or the elastic member are formed with a conductive material and form an electrode of the capacitive sensor.

If the touch sensor is a capacitive sensor, it can detect the touch or approach of a user's hand. A capacitive sensor is based on the change of the electric field in the vicinity of the electrode. For example, the capacitance between the electrode and the earth potential is measured. The handle body with its functional components, for example, acts like a capacitor plate in relation to its environment, which represents the reference ground potential. If a finger or a hand of the user approaches the handle body and thus the electrode, then the capacity increases.

The capacitance can be measured, for example, by a standard RC oscillator circuit or special components designed for capacitive measurement.

If the touch sensor is a microswitch or piezo sensor, or is based on active materials, then unlike a capacitive sensor, a minimum force is required to deform the surface of the switch with a force. This minimum force is given, for example, by the force between the fingers gripping the grip element of the handle body. For example, a certain force threshold must first be exceeded. However, this is the gripping force between the fingers and not the force required to bend or deform the elastic member.

Generally, it is also conceivable that the touch sensor can be omitted. In this case, the touch is detected by the force sensor, whereby a certain base force, for example a force threshold value, must be exceeded by the user before an adjustment action is triggered.

The force sensor is typically a sensor that is connected to the elastic member and measures the deformation of the elastic member caused by the force applied by the user. The force sensor preferentially measures the direction and amount of force applied via the deformation caused by the force. For example, the sensor is mounted on a bending point of the elastic member.

In one implementation of the force sensor for application to an elastic member, it is formed as a strain gauge. In a further implementation, the force sensor is formed with an electroactive material, for example as an electroactive polymer.

The measured value provided by the force sensor, for example a resistance value, is in linear relationship with the deformation, such as bending or compression, of the force sensor. The deformation of the force sensor is in linear or non-linear proportion to the force applied by the user. This ratio depends on the material of the elastic member and the design of the grip element.

In the following, some designs of a manual operating element are described, in which the force sensor is applied to the elastic member.

For example, in one implementation, the elastic member is formed by a solid body having at least one cavity arranged under an outer surface of the handle body, the force sensor being attached to the solid body in the region of the cavity. For example, in this implementation, the handle body is formed in one piece, the cavity being formed by corresponding bores and/or cut-outs as described above. The massive body is weakened thereby purposefully and enables a measurable deformation by the application of force of a user.

However, it is possible to cover the body with a coating, for example for safety or aesthetic reasons. The force sensor is preferably attached to an inner side of the body in the area of the cavity or the elastic member. It is also possible to attach the force sensor to an outside of the elastic member.

In another design, the handle section is elastic and contains the elastic member. The force sensor is attached to the elastic member. Preferably the handle section contains the elastic member completely. A deformation of the handle section due to the application of force by the user can thus be transferred directly to the elastic member contained and thus to the force sensor.

For example, the elastic handle section on the inside includes a metallic elastic member on which the force sensor is mounted.

Alternatively, the handle section forms an integral element with the elastic member and has two parallel or substantially parallel handle section parts, each connected to the mounting body and arranged to clampably grip the component of the furniture together with the mounting body.

In another alternative implementation, the handle section is rigid and elastically connected to the mounting body. The elastic member extends between the handle section and the mounting body and is contained in the latter. The force sensor is in turn attached to the elastic member. In this case, for example, the handle section is rigid and connected to the mounting body via a hinge, so to speak. When the handle section is actuated, the elastic member is bent, whereby the bending point is in the region of the mounting body, but not in the handle section. In this case, the force sensor is also located inside the mounting body.

Preferably, the elastic member is permanently attached to the rigid handle section, which makes it easy to attach the elastic member to the handle section. In any case, the force sensor is predominantly or completely located inside the mounting body.

In a further alternative implementation, the mounting body and the handle section are connected to each other via an elongated, rigid connecting body, whereby the connecting body is on one side rigidly or essentially rigidly connected to the handle section and on the other side rotatably mounted in the mounting body at a fixed pivot point. The elastic member elastically couples the connecting body to the mounting body. The elastic coupling can, for example, be established via a spring element or another material with resilient or elastic properties. The elastic member acts, for example, as a restoring element whose deflection can be measured via the force sensor, for example the strain gauge sensor.

In other implementations of the manual operating element, the force sensor comprises at least one pressure sensor, e.g. a piezo-based pressure sensor, which is mounted or integrated on or in an outside or surface of the handle section.

For example, in such an implementation the handle body is formed with a rigid part comprising the mounting body and the handle section. The elastic member is formed by a body of the pressure sensor. The force sensor is, for example, a piezo sensor or another pressure measuring sensor that is elastically deformed by the application of force. The degree of deformation represents the force exerted by the user on the handle section. Preferably, one such sensor is attached to the handle section for each force direction.

In addition to the handle section, the manual operating element can also include a control panel with conventional operating elements, e.g. with buttons, in order to store and/or select memo positions, for example, irrespective of the implementations shown. Memo positions can represent certain settings of the furniture, such as a certain height or a certain angle of inclination or similar.

Such a control panel is, for example, attached to a rigid part of the manual operating element, such as the mounting body. This prevents that pressing a key inadvertently triggers an adjustment.

Alternatively, the control panel can also lie at least partially on or in a surface of the handle section itself. With such an arrangement it is possible to hold a button for a memo position while the adjustment is carried out with the handle section. In this case, for example, the system will carry out the adjustment until the stored memo position is reached.

Buttons on the control panel can, for example, be mounted on the upper side of the handle section, on a front side, e.g. a vertical side of the handle section, or on a rigid surface of the manual operating element.

The various implementations of the manual operating element, each providing a force value and a touch value, enable the improved operating concept to be applied in a control system for operating an electrically adjustable piece of furniture.

Such a control system includes, for example, a manual operating element in accordance with one of the embodiments described above and a controller having a communication link to the manual operating element. The controller is arranged to generate a control signal for at least one actuator or adjusting drive of the piece of furniture based on the force value and the touch value. The communication link can be implemented wired or wireless.

For example, the controller is designed to use the control signal to initiate and/or maintain an adjustment of the adjusting drive as a function of the touch value and to set an adjustment speed of the adjusting drive as a function of the force value.

The controller may be in the form of a central control unit that e.g. controls one or more connected adjusting drives. In such implementation, the controller is a central controller. In other implementations, one or more controllers are integrated with respective adjusting drives, e.g. are integrated into a housing of the adjusting drives. In such implementation with more than one controller, these controllers are all connected to the manual operating element and receive the force value and the touch value. This can e.g. be accomplished with a bus system, via which the force value, the touch value, the control signal and potential other control signals are distributed to every node of the bus system. For example, the controllers, the manual operating element and possibly other bus stations are connected to such nodes of the bus system.

The controller can perform one or more of the following operations: detecting whether at least one finger of the user touches the handle section; measuring the direction of force application; measuring the amount of force application; measuring the duration of force application; determining the rotational speed and direction of rotation of one or more adjusting drives of the furniture system taking into account the direction of amount and duration of force application; generating the corresponding control signals for the adjusting drives of the furniture system.

For example, the controller is arranged to use the control signal to further adjust the adjustment speed of the adjusting drive as a function of a duration of a force acting on the handle section and/or a duration of contact with the handle section.

In a further implementation, the controller is arranged to use the drive signal to set the adjustment speed of the adjusting drive as a function of the force value weighted by a first factor and of a force integral value weighted by a second factor which is based on a time integral of the force value. This enables intuitive and individual control for the user, who can achieve a desired adjustment result by varying the applied force and the duration of the applied force.

For example, the controller is designed to determine the force integral value based on a time history of the force value and on at least one previous force integral value.

The controller can be arranged in various implementations at a spatial distance from the manual operating element. Alternatively, the function of the controller can also be arranged in or on the manual operating element, for example directly on the communication unit. For example, the controller could also be formed with the manual operating element as an integral component, so that the control signals for the adjustment drives of the piece of furniture could emanate directly from such an integral manual operating element. This can be particularly useful if the various components of the adjustable piece of furniture are connected to each other via a bus system.

In various implementations, the controller is designed to give or initiate feedback to the user, for example in the form of acoustic, visual and/or tactile feedback.

The improved operating concept further comprises an electrically adjustable piece of furniture which comprises a control system according to one of the implementation examples described and at least one adjusting drive. The piece of furniture is, for example, a table, a bed, a piece of seating furniture or a piece of reclining furniture. However, other adjustable pieces of furniture are not excluded.

The improved operating concept also relates to a method of operating an electrically adjustable piece of furniture having a manual operating element comprising a force sensor for sensing a directional force value corresponding to an applied force and a touch sensor for sensing a touch value in response to a user touching the manual operating element. The method comprises transmitting the force value and the touch value to a controller of the piece of furniture and generating, in the controller, a drive signal for at least one adjusting drive of the piece of furniture based on the force value and the touch value.

In an embodiment, the method further comprises initiating and/or maintaining an adjustment of the adjusting drive with the drive signal in dependence on the touch value and adjusting an adjustment speed of the adjusting drive with the drive signal in dependence on the force value.

For example, the drive signal is also used to set the adjustment speed of the adjusting drives as a function of a duration of a force acting on the handle section and/or a duration of a touch to the handle section.

The adjustment speed of the adjusting drive can be set in various configurations with the control signal as a function of the force value weighted with a first factor and a force integral value weighted with a second factor based on a time integral of the force value.

Further details of the method result for the reader directly from the description of the various embodiments of the manual operating element or the control system.

BRIEF DESCRIPTION OF THE DRAWINGS

In the following, the invention is explained in detail with reference to the drawings on the basis of exemplary embodiments. Components that are functionally identical or have an identical effect can be provided with identical reference signs. Identical components or components with identical functions may only be explained with reference to the Figure in which they appear first. The explanation is not necessarily repeated in subsequent Figures.

In the drawings.

DETAILED DESCRIPTION

Figure 1:
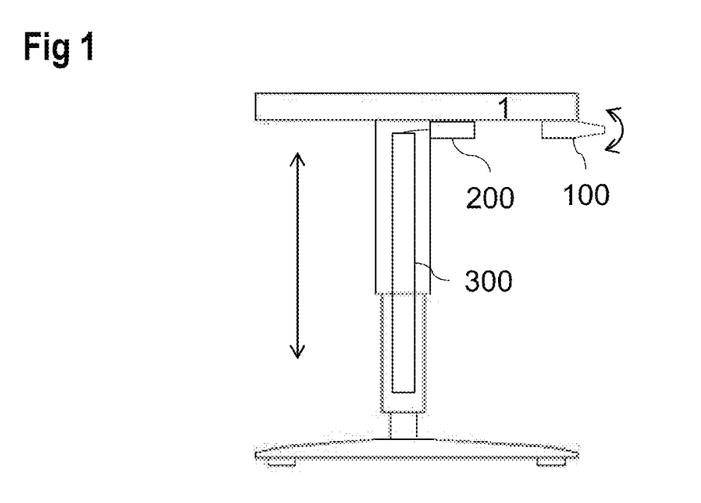
FIG. 1 shows an example implementation of an electrically adjustable piece of furniture.

FIG. 1 shows a schematic layout of an electrically adjustable piece of furniture, which in this case is designed as a height-adjustable table. The table has a table top 1 to which a manual operating element 100 is attached. To operate the table, the manual operating element 100 is connected to a controller 200, which controls an adjusting drive 300 for height adjustment of the table or the table top 1.

The manual operating element 100, which for example has a lever-like design, has a handle body consisting of a mounting body, a handle member or handle section and an elastic member, as well as a force sensor and a touch sensor. By applying force to the handle body or the manual operating element 100, symbolically represented by the arrows on the manual operating element 100, a force value can be detected via the force sensor, which is evaluated, for example, together with a touch value in the controller 200 in order to generate corresponding control signals for the adjusting drive 300. The sensors and the individual components of the handle body are not shown in FIG. 1 for reasons of simplicity, but are explained in more detail in connection with FIGS. 2 to 9 and 10A and 10B.

In the various embodiments, the manual operating element 100 comprises a mounting body 5, a handle member or handle section 6 connected to the mounting body and an elastic member operatively connected to the handle section 6. Mounting body 5 can be mounted on the piece of furniture. It is mounted in such a way that the handle section projects over the piece of furniture and can be gripped by the user. In a table, for example, the mounting body is mounted on the underside of table top 1 in such a way that the handle section protrudes from table top 1 when viewed from above or below.

In the case of an electrically adjustable bed frame not shown here, the mounting element can, for example, be mounted on a part of the bed frame, for example in the area under the mattress and above the bed frame. Pulling the handle section, for example, makes the head section steeper or flatter. Corresponding attachments can also be used for other seating and lying furniture. The fixing can be done with a screw connection. Generally, the manual operating element 100 is not part of the furniture but is fixed to a part of the furniture with the mounting body 5.

The handle section is typically shaped like a lever and can be operated by the user with one or two fingers of one hand. When operating with one finger, for example, the user presses on the handle section from above or below. When operating with two fingers, for example, the user takes the handle section between thumb and index finger. The handle section is thus gripped more firmly and enables a reliable evaluation of the touch.

The handle section allows deflection along one direction of movement. When mounted on a tabletop 1, as shown in FIG. 1, this deflection is vertical. A force effect is therefore only measured and evaluated in the vertical direction, for example for an up and down movement of the table.

Alternatively, the handle section can also be mounted in such a way that the handle section allows horizontal deflection. An evaluation in horizontal direction is conceivable for a horizontal movement of the table top or a display support in order to place a display closer or further away.

In the configurations shown below, the force is measured by measuring the deformation or bending of an elastic member caused by the force. Such a measurement can be measured, for example, by a strain gauge sensor, which is applied to the top and/or bottom of the elastic member.

In principle, the elastic member is an elastic rod which is firmly clamped at one end and is loaded at another end by a transverse force and/or a moment. From the bending stiffness and the length of the rod, it is possible to determine an exact relationship between an applied force and a lowering, or a resulting angle of inclination. Instead of measuring the angle of inclination caused by the bend, it is also possible to measure the change in length of the top and/or bottom side of the rod caused by the bend, for example by a strain gauge attached to the top and/or bottom side of the rod. On one side there is a compressive stress while on the other side there is a tensile stress.

In FIGS. 2 to 9, the manual operating element 100 is fastened to an underside of the table top 1 as an example and contains, in addition to the mounting body 5 and the handle section 6, a communication unit K via which a connection to the controller 200 can be established. The tabletop 1 is chosen as an example only and is generally intended to represent a component of a piece of furniture.

Figure 2:
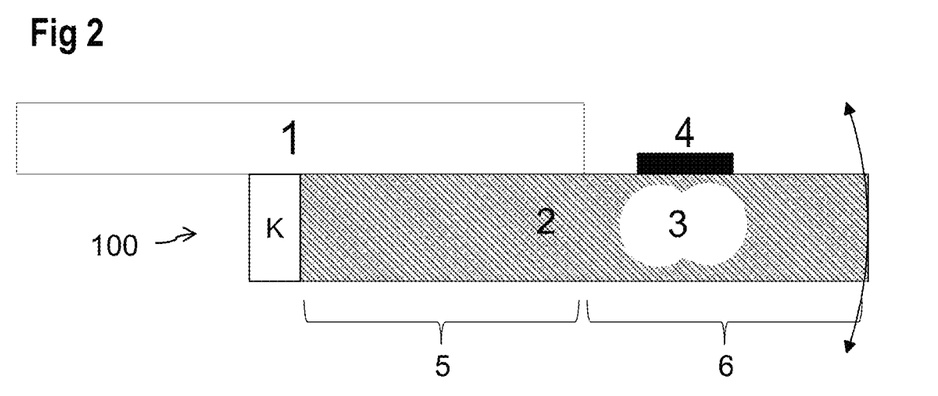
FIGS. 2 to 9 and FIGS. 10A and 10B show different configurations of a manual operating element.

With reference to FIG. 2, the handle body is formed, for example, by a solid body, such as a piece of metal 2, which has a hole or milling 3 in the region of the handle section 6, through which the otherwise solid body 2 is intentionally weakened. This weakening enables deformation of body 2, which can be detected by a force sensor in the form of a strain gauge 4 or an electroactive polymer.

The force sensor 4 is used to measure a direction-dependent force value corresponding to a force acting on the handle section 6. Due to its positioning above the bore or milling 3, the force sensor 4 is operatively connected to the elastic member formed as a result.

If the body 2 is electrically conductive, it can simultaneously serve as an electrode of a capacitive sensor, which serves as a touch sensor for recording a touch value in dependence on a touch of the handle section by the user.

Figure 3:
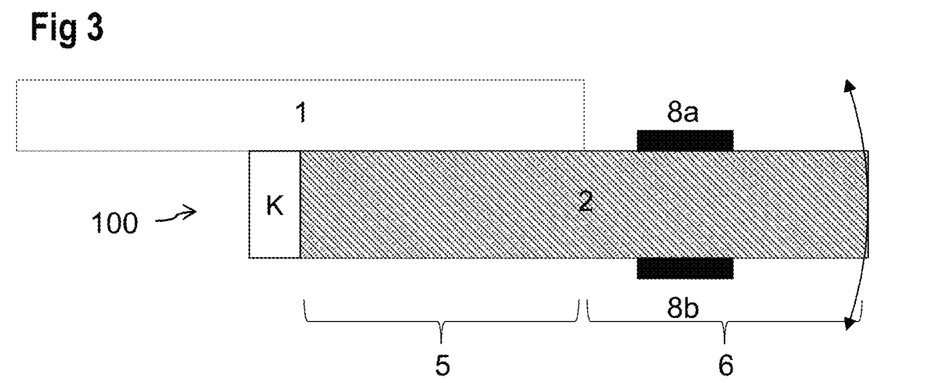

With reference to FIG. 3, the operating element 100 is formed from a rigid, e.g. metallic rod 2 on which two pressure sensors 8a and 8b are mounted, each of which is deformable due to a force applied by the user. The pressure sensors 8a and 8b, for example, are designed as piezo sensors. The force direction can be determined from the measured values of the two pressure sensors 8a, 8b.

As shown in FIG. 3, the pressure sensors 8a, 8b are applied to an outside or surface of the handle section 6 or alternatively to an outside or surface of the handle section 6. For this purpose, for example, recesses can be provided in the surface of the rod 2, which accommodate the pressure sensors 8a, 8b. The height of the recesses, for example, is adapted to the dimensions of the pressure sensors 8a, 8b, especially in the compressed state.

If the rod 2 is conductive, it can in turn be used as the sensor electrode of a capacitive touch sensor to detect a touch value.

Figure 4:
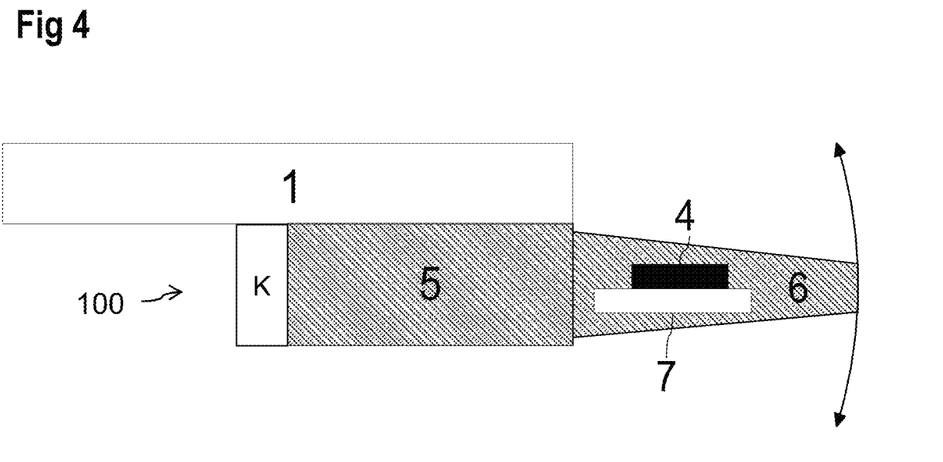
Figure 5:
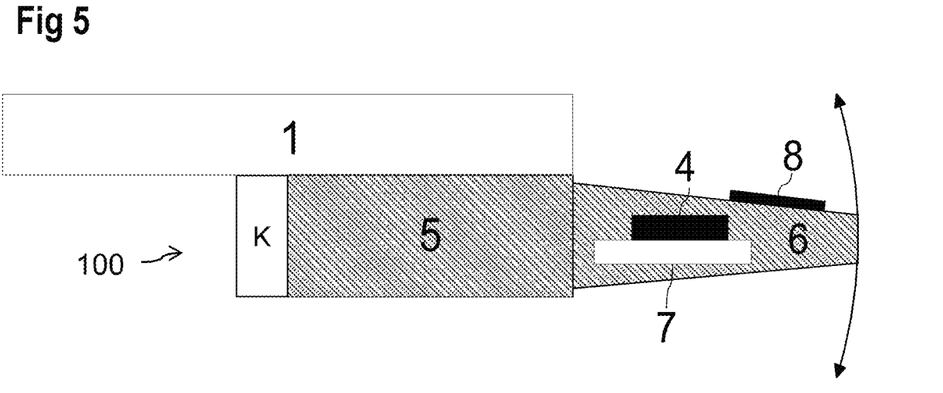

In FIGS. 4 and 5, the mounting body 5 is connected to the table top 1. The handle section 6 is elastic in itself and contains an elastic member 7 and a force sensor 4 applied to it, which measures the deformation of the elastic member 7 due to the deformation of the handle section 6. If the elastic member 7 is a conductive member, it can be used as the sensor electrode of a capacitive touch sensor.

Contrary to FIG. 4, a touch sensor designed as a pressure sensor 8 is provided in FIG. 5, which detects contact with the handle section 6 or the manual operating element 100.

The elastic handle section 6 can, for example, be made of an elastic plastic. In this case, an elastic member 7 is embedded in the handle section as a bending body with sensor 4. If the handle section 6 is deformed, the bending body inside is also deformed. Handle section 6 and bending body 7 together have sufficient elasticity to return to a defined rest position at the end of the application of force. In this case, the handle section 6 is rigidly connected to the mounting body 5. The handle section 6 can, for example, have a recess into which bending bodies 7 and sensor 4 are inserted and moulded or glued.

Figure 6:
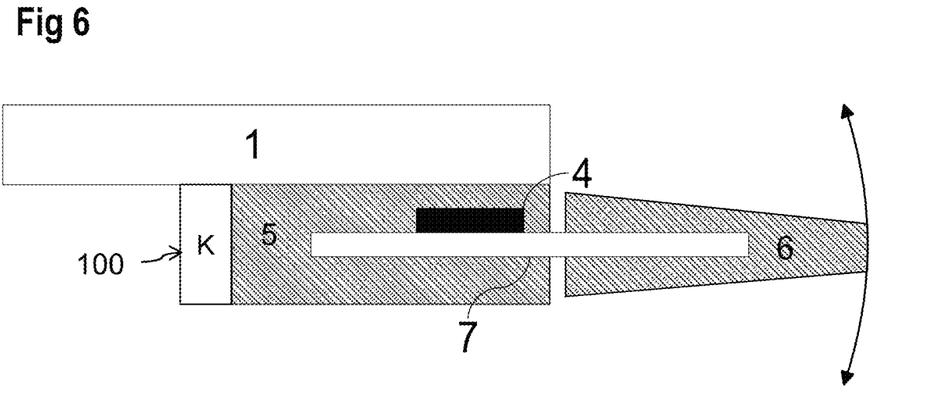
Figure 7:
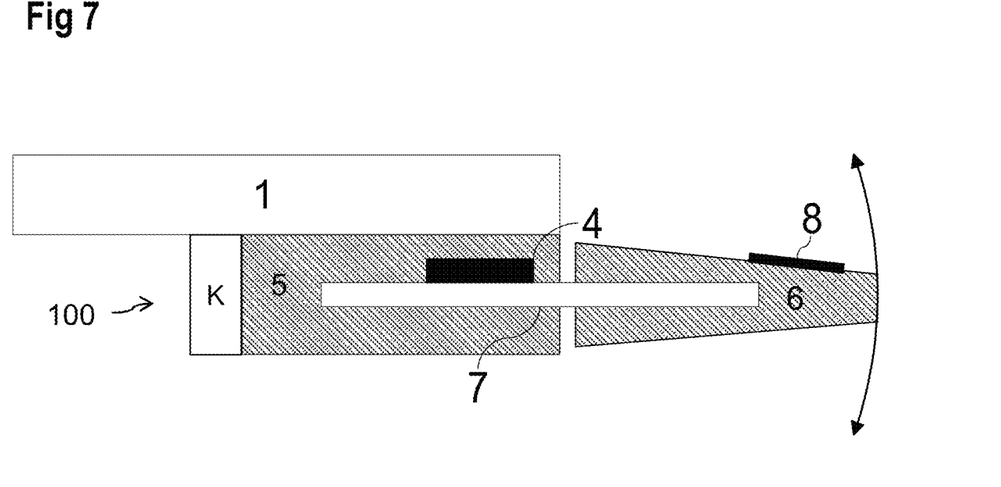

In FIGS. 6 and 7, the handle section 6 is rigid and elastically connected to the mounting body 5. For example, the rigid handle section 6 contains an elastic member 7 with which it is anchored in the mounting body 5. In addition, the handle section can be connected to the assembly body 5 via a joint that is not shown. A force sensor 4, e.g. a strain gauge sensor, is mounted on the elastic member 7 in the region of the mounting body 5 to measure the bending of the elastic member 7.

If the elastic member 7 is a conductive member, it can be used as a sensor electrode of a capacitive touch sensor.

In analogy to the difference between FIG. 4 and FIG. 5, FIG. 7 differs from FIG. 6 by an additional pressure sensor 8 on the handle section 6, which acts as a touch sensor. By providing the pressure sensor 8 in FIGS. 5 and 7, a capacitive measurement of a touch is dispensable. The elastic member 7 does not necessarily have to be conductive to act as the electrode of the capacitive sensor.

Figure 8:
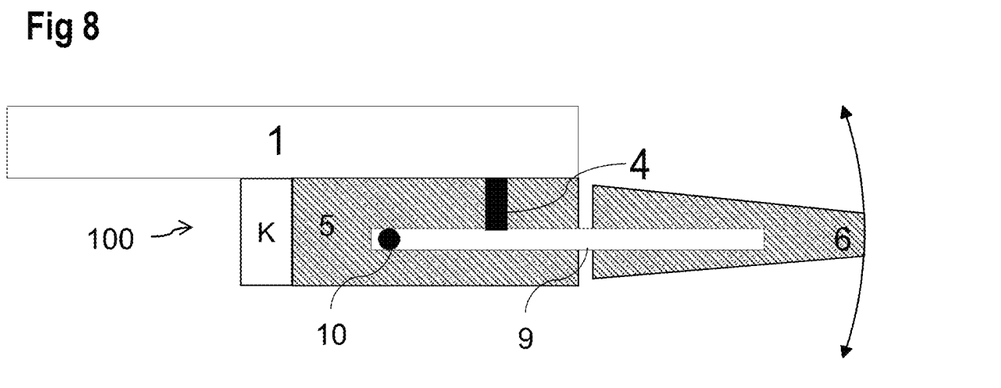

In the configuration of FIG. 8, the manual operating element 100 comprises a rigid rod 9 which is mounted in the mounting body 5 on a rotary axis 10. At one end remote from the axis 10, the connecting body 9 is rigidly or substantially rigidly connected to the handle section 6. Inside the mounting body 5, the connecting body 9 is elastically coupled to the mounting body 5. The elastic coupling represents a restoring mechanism to which a strain gauge or equivalent sensor 4 is attached to measure the deflection. When the handle section 6 is pulled or pressed, the rigid rod 9 rotates about the axis of rotation 10. The elastic member that couples the rod 9 to the mounting body 5 and to which the force sensor 4 is attached forms the restoring mechanism.

If the rod 9 is conductive, it can again be used as the sensor electrode of a capacitive touch sensor. Alternatively or additionally, the use of a pressure sensor as a touch sensor can be considered, as shown in FIGS. 5 and 7.

Figure 9:
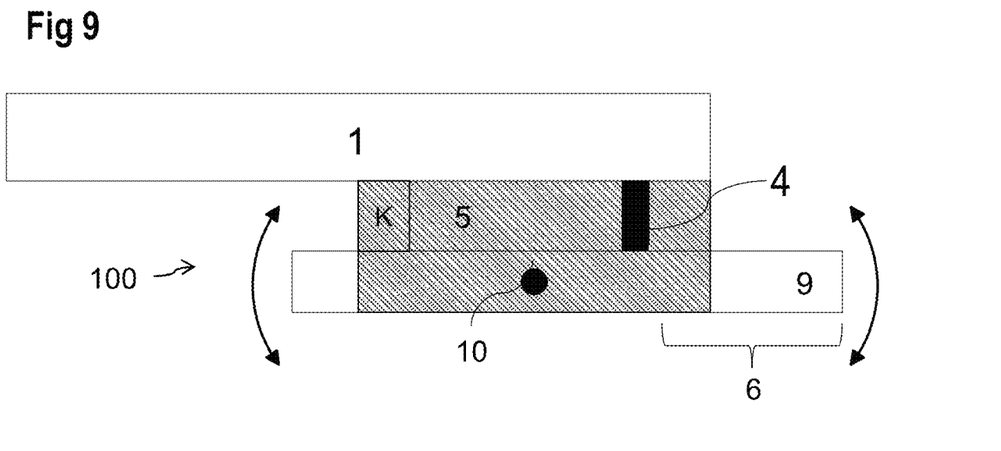

FIG. 9 shows a variation of the principle shown in FIG. 8. Accordingly, the manual operating element 100 in turn has a rigid element 9 which can be rotated about an axis of rotation 10 and thus represents a kind of rocker. Again, the rocker is equipped with a restoring mechanism, for example a spring, which holds the rocker in a horizontal position when no force is applied. The restoring mechanism constitutes the elastic member against which strain or compression can be measured by means of a strain gauge sensor 4 or an active polymer. The part of the rigid element 9 protruding beyond the table top forms the handle section 6 in this design.

In FIGS. 8 and 9, the axis of rotation 10 is mechanically connected to the mounting body 5.

Figure 10A:
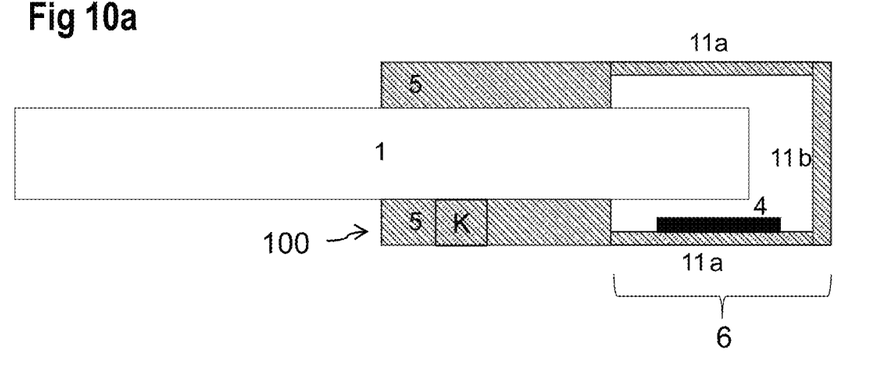
Figure 10B:
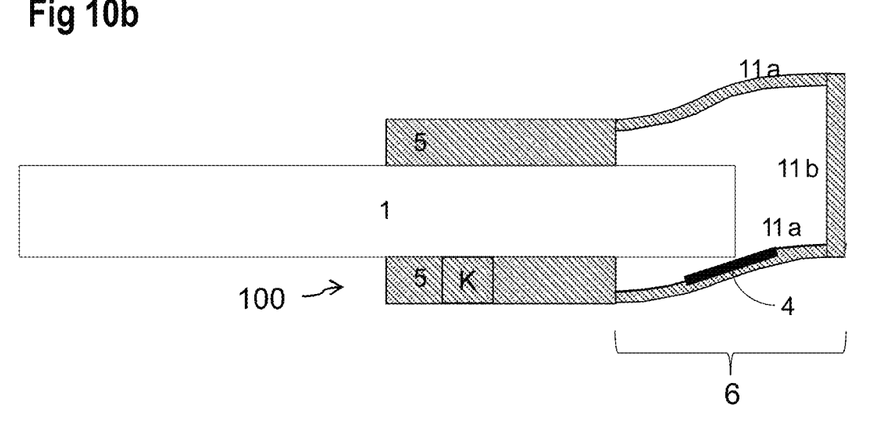

FIGS. 10A and 10B show a configuration of a manual operating element 100 in which the handle section 6 forms an integral element with the elastic member and has two parallel or substantially parallel handle section parts 11a each connected to the mounting body 5. A vertical component 11b, mechanically coupling the two parallel components 11a, is provided on the side remote from the mounting body 5. Components 11a and 11b can also be designed in one piece. Together with the mounting body 5, the parallel handle section parts 11a enclose the table top 1 like clamps. The parallel handle section parts 11a are elastically deformable.

In FIG. 10A, the manual operating element 100 is not actuated, the handle section parts 11a are not deformed and are horizontal.

During operation, the handle section 6 is pressed or pulled, creating a deformation of the two parallel handle section parts 11a. This deformation can be measured by at least one sensor 4 attached to at least one of the two parallel handle section parts 11a.

FIG. 10B shows the manual operating element 100 in the actuated state, in particular exerting a force upwards, whereby the parallel grip element parts 11a are bent in an S-shape. The deformation is strongly exaggerated to better illustrate the principle. The vertical part 11b remains essentially vertical and does not deform. A deformation of the parallel handle section parts 11a is again measured via a strain gauge sensor or an electroactive polymer as force sensor 4.

If the handle section parts are electrically conductive, they can in turn be used as the sensor electrode of a capacitive touch sensor. Alternatively, the use of a separate touch sensor remains.

The manual operating element 100 can also have a control panel in addition to the handle section, independently of the configurations shown in FIGS. 2 to 9 as well as 10a and 10b. This is shown schematically in FIG. 11. The representation is kept general and is not limited to individual special implementations.

Figure 11:
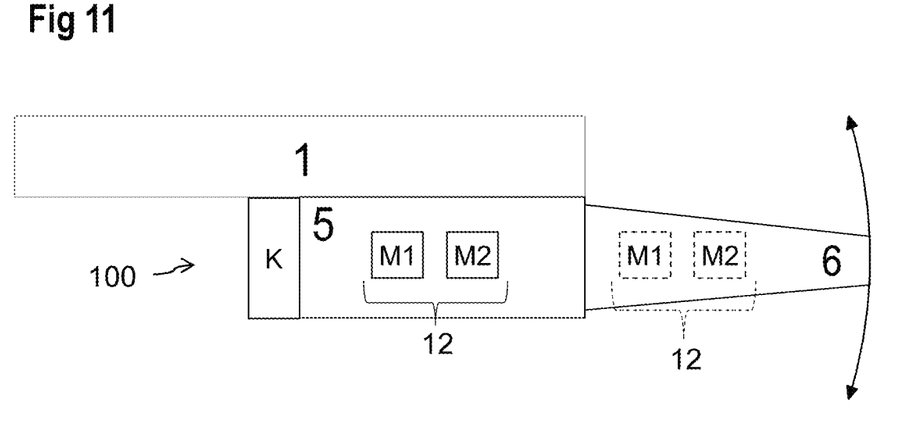
FIG. 11 shows a further configuration of a manual operating element with an additional control panel.

The control panel 12, for example, comprises two control elements M1, M2, which are formed, for example, with conventional buttons. The operating elements M1, M2 are used for example to store and/or select memo positions. Memo positions can represent certain settings of the furniture, such as a certain height or a certain angle of inclination or the like.

The control panel 12, for example, is attached to a rigid part of the manual operating element, such as the mounting body 5. This prevents the pressing of a button unintentionally triggering an adjustment.

Alternatively, the control panel can at least partially lie on or in a surface of the handle section 6 itself. With such an arrangement it is possible to hold a button for a memo position while the adjustment is carried out with the handle section. In this case, for example, the system will carry out the adjustment until the stored memo position is reached. This alternative design is shown dashed in FIG. 11.

Generally, buttons on the control panel can be mounted on the upper side of the handle section 6, on a front side of the handle section 6, for example a vertical side, or on a rigid surface of the hand control unit, such as the mounting body 5.

A control system for operating an electrically adjustable piece of furniture, for example, is formed by a manual operating element 100 according to one of the embodiments described and the controller 200 as shown in FIG. 1A. There is a communication link between the controller 200 and the manual operating element 100, so that the controller can generate a drive signal for the adjusting drive 300 based on the force value and the touch value.

Thus it is possible for the control system to initiate and/or maintain an adjustment of the adjusting drive with the drive signal as a function of the touch value and to set an adjustment speed of the adjusting drive as a function of the force value.

In the simplest configuration, only the force in one direction, for example in the vertical direction, is measured and used as a trigger for an adjustment in the corresponding direction, whereby the adjustment speed is constant. However, a constant speed is often not adapted to the respective adjustment situation. Depending on the personal preference of a user or a loading of the table, the speed should be selectable by the user.

For example, the user wants to move an empty table faster than a table with sensitive objects that could fall over. A constantly high adjustment speed would make it difficult to reach a certain position exactly. With a constant low adjustment speed, on the other hand, it is easy to reach a certain position exactly, but adjustment between extreme positions, for example from a sitting position to a standing position on a height-adjustable table, would be correspondingly slow. When adjusting at constant speed, only one characteristic of the force exerted by the user is used, namely the direction of the force.

If the force is represented as a value with sign and magnitude, it becomes apparent that the sign corresponds to the direction of the force. For example, a negative sign corresponds to a downward movement and a positive sign corresponds to an upward movement. The amount, on the other hand, corresponds to the force exerted by the user on the grip element. A higher amount corresponds to a higher force, which can be taken into account by the system.

For example, the controller 200 can control the adjusting drive 300 in such a way that the higher the amount of force exerted by the user, the faster the adjustment is, and vice versa. It can also be advantageous to include the time the force is exerted in the selection of the adjustment speed. For example, it can be taken into account how long a constant force is exerted, whereby a longer exercise causes a faster movement or adjustment. The direction of the force and the absolute value F of the force can be determined from the direction-dependent force value of the force sensor.

Thus, for example, the desired nominal rotational speed n of an adjusting drive used to adjust the furniture system results from the following equation:

$$n = K_1 \times F + K_2 \times \int F \, dt$$

The nominal rotational speed n is calculated from the magnitude of the force F multiplied by a constant K1 and the time integral of the magnitude of the force multiplied by a constant K2. The two constants K1 and K2 are independent of each other.

In another configuration, the constants can be dependent on the force. It is conceivable that slightly different constants are used for different force ranges.

In some configurations, the controller is also equipped to use the control signal to set the adjustment speed of the adjusting drive 300 as a function of a duration of a force acting on the handle section 6 and/or a duration of contact with the handle section 6.

Figure 12:
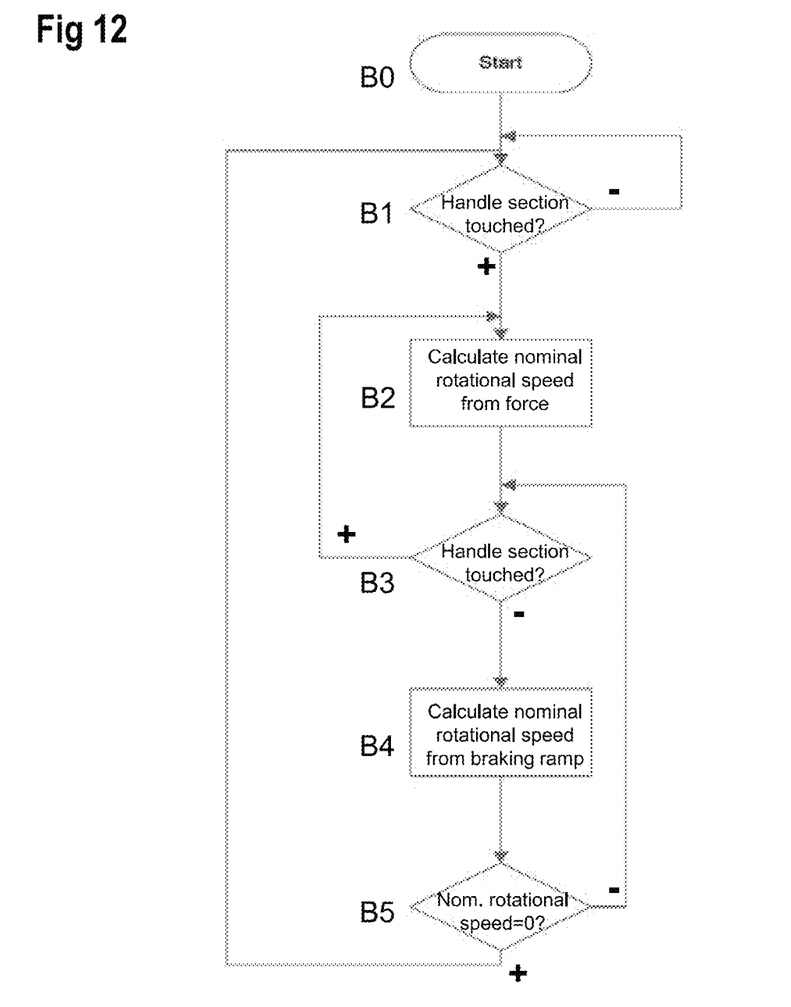
FIG. 12 shows an exemplary flow chart of a control method.

A corresponding sequence is shown, for example, in FIG. 12. After starting in block B0, the system waits in block B1 until the handle section is touched. This is determined e.g. capacitively, by a force threshold value or by a piezo sensor on the handle section.

The system then calculates the target speed in block B2 from the force that the user exerts and/or has exerted on the handle section. It should be noted that in some embodiments not only the current, momentary force is taken into account, but also the force curve in the past. This target rotational speed is then passed on to the control system, which then determines the corresponding signals for the adjusting drives.

The calculation and setting is repeated as long as the user touches the handle section, as shown in block B3.

As soon as the user no longer touches the handle section, the system in block B4 no longer calculates the target rotational speed on the basis of the force but on the basis of a configurable braking ramp and reduces the target rotational speed to zero if the user still does not touch the handle section, see block B5. For example, the target rotational speed is continuously decreased to zero if the touch value indicates that the user is not touching the manual operating element, in particular the handle section. The target rotational speed can be decreased linearly or non-linearly.

As soon as the target rotational speed reaches zero, the evaluation starts again at block B1. If the target rotational speed is not zero and the user again touches the handle section, the evaluation starts again at block B2.

Figure 13:
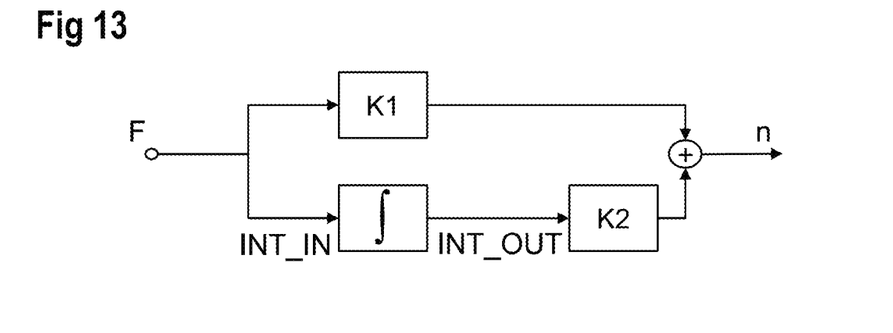
FIG. 13 shows a schematic block diagram for processing a force value.

An implementation of the calculation of the nominal rotational speed n is shown in FIG. 13 at block diagram level. Here, INT_IN represents the input value of the integral and INT_OUT its output value.

In the sequence shown in FIG. 12, the nominal rotational speed is generally a function of the force at the current time instant t0 and other force values at earlier time instants.

$$n_{target} = f(F_{t0}, F_{t1}, F_{t2}, \ldots)$$

In two variants of possible configurations, in addition to the instantaneous force, the temporal course of the applied force is also taken into account in order to find unavoidable fluctuations in the application of force by the user only dampened at the nominal rotational speed and thus enable more uniform adjustment.

For the specific implementation of the integral, as shown above in the formula, there are the following characteristics:

$$\text{Output} = \text{Output} + \frac{\text{Input}}{x} \quad \text{Variant 1}$$

In this case, the current applied force is weighted with a factor x and added to the previous output.

$$\text{Output} = \text{Output} + \frac{\text{Input}}{x} - \frac{\text{Output}}{y} \quad \text{Variant 2}$$

In this case, not only the "inflow" of the force, but also an "outflow" of the force, weighted with a factor y, is included.

Figure 14:
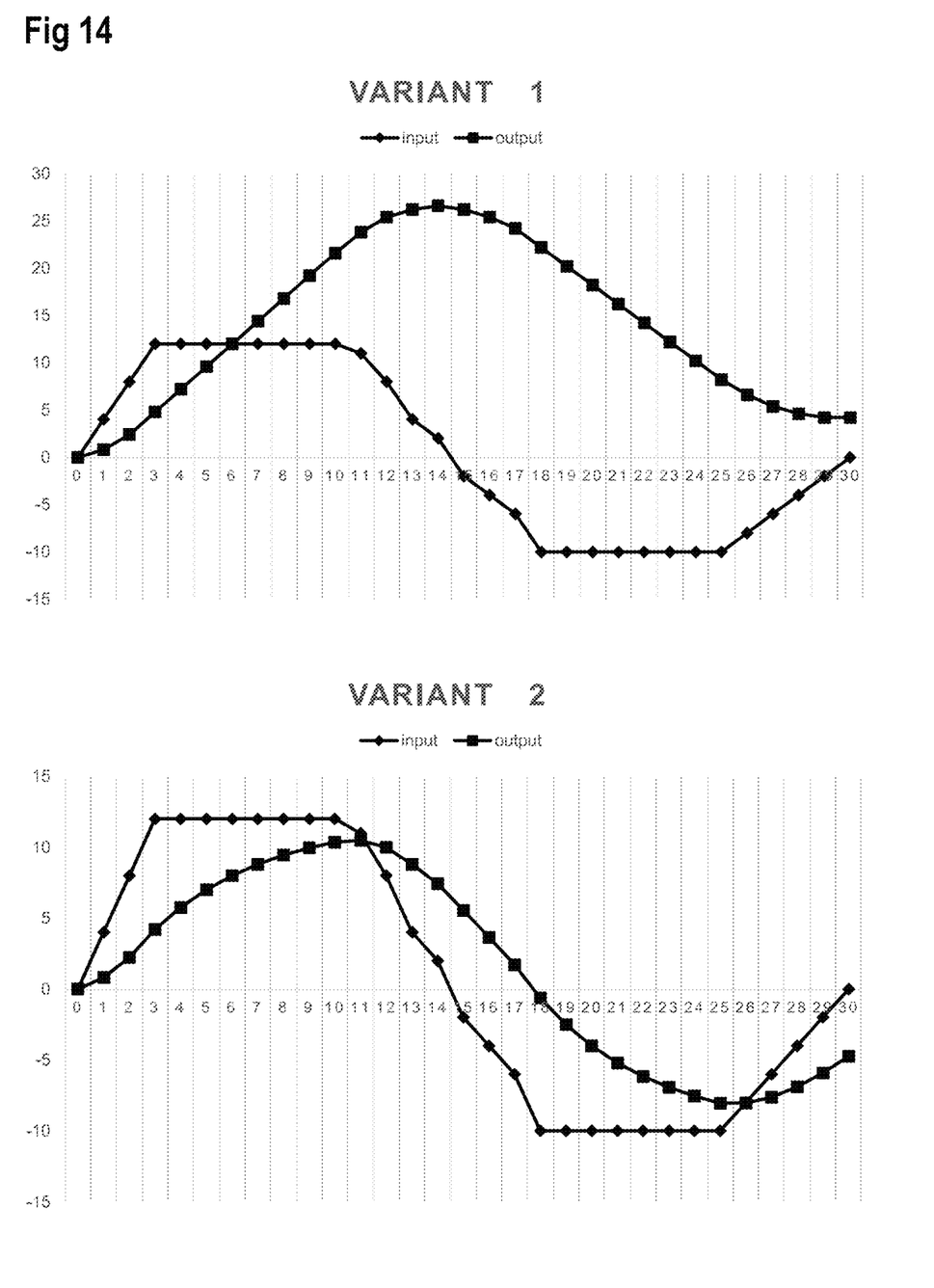
FIG. 14 and FIG. 15 show exemplary signal-time diagrams.
Figure 15:
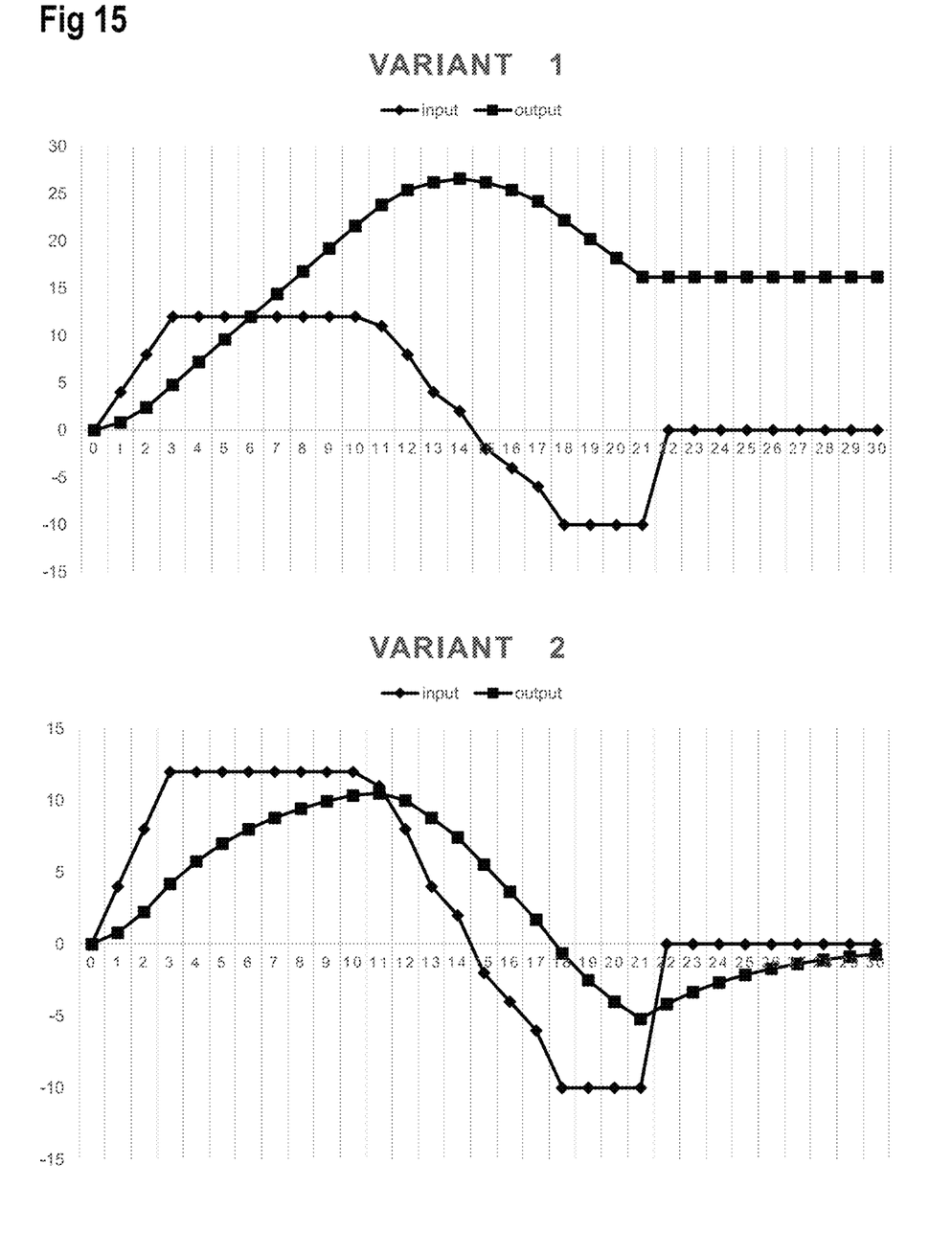

FIGS. 14 and 15 show exemplary signal-time diagrams for the integral calculation according to the two variants.

The line marked with diamonds shows an example of the force exerted by the user according to the transmitted force value. The direction in which the user exerts the force corresponds to the sign, e.g. positive corresponds upwards; negative corresponds downwards.

The line marked with squares shows the resulting speed curve, calculated with the two output formulas above.

The two illustrations in FIG. 15 show a special feature of variant 2. Here, for example, the user releases the handle section at time 22. The force is 0. The formula results in a braking effect similar to a braking ramp, recognizable as an exponential course of the starting line from time 22 to 30. It is therefore theoretically possible to omit the braking ramp in the flowchart.

Once the target rotational speed is known, the current actual rotational speed can easily be measured, e.g. with Hall sensors or the like.

In one implementation, the currently calculated target rotational speed is transferred to a controller which works to adapt the actual rotational speed to this target rotational speed as quickly as possible. This may have the consequence that an abrupt pulling/pushing of the operating element would lead to a sudden change in speed, which may result in increased mechanical wear or falling objects on the table. The same applies to an abrupt release of the operating element and the associated sudden reduction to zero speed.

It is therefore be beneficial to filter through a low-pass filter so that the target rotational speed values no longer show abrupt changes or high rates of change.

Another possibility is the use of acceleration ramps. Acceleration ramps do not filter target rotational speed values, but serve to define the acceleration from an actual speed value to a target speed value. It should be noted that it can be spoken of acceleration, regardless of whether it is a positive acceleration or a negative acceleration (braking).

In contrast to a table system with constant speed, there are three situations possible for drives with variable speed:
Accelerating from 0 to v1: Start
Accelerate from v1 to 0: Stop
Accelerating from v1 to v2: speed changes while driving Generally spoken, the speed changes from a first target rotational speed to a second target rotational speed, wherein one of the first and the second target rotational speed may be zero.

In the simplest case, it is possible to define an acceleration ramp that can be used for all three situations, but this is not useful for a variable speed table because the situations have different requirements that are reflected in different characteristics of the ramp:

While in both the Start and Stop situations a force-dependent acceleration is also possible, as in these situations the operating element is touched, in the "speed changes while driving" situation such a type of acceleration is no longer possible because the operating element has been released.

For example, there are now several acceleration ramps in a table system with variable speed, which can be parameterized separately from each other. These acceleration ramps can then be used in one or more situations.

Basic Information about Acceleration Ramps:

An acceleration ramp is used when it is necessary to change the current actual rotational speed to a target rotational speed. Based on the current speed, intermediate speeds between the actual rotational speed and the target rotational speed are determined (e.g. interpolated or determined via a table).

An acceleration ramp determines the speed curve between a current actual rotational speed and a target rotational speed. This process can be linear or non-linear. This process can also be dependent on the force or the change in force exerted by the user via the operating element. For example, the acceleration ramp can be displayed as a v/t diagram.

The time span of the ramp, i.e. the time span in which the speed is changed, can be variable or constant. The acceleration during this time can be constant or variable, especially depending on the actual force. A change of the target rotational speed during the time span can cause a change of the acceleration and/or a change of the time span.

There are at least 8 different types of acceleration ramps which can be selected and parameterized for the three situations:
(1) Constant, force-independent acceleration without time limit
(2) Non-linear, force-independent acceleration without time limit
(3) Constant, force-independent acceleration with time limitation
(4) Non-linear, force-independent acceleration with time limitation
(5) Constant, force-dependent acceleration without time limit
(6) Non-linear, force-dependent acceleration without time limit
(7) Constant, force-dependent acceleration with time limitation
(8) Non-linear, force-dependent acceleration with time limitation Acceleration ramp 1: This ramp is characterized by a constant, force-independent acceleration. The acceleration ends when the target rotational speed is reached, and is not minimized by a certain period of time. The value for the acceleration can be parameterized. The acceleration is constant and indicated by a value that is the same for all speed differences. Thus the acceleration phase takes longer for large speed differences than for shorter speed differences. The acceleration ends when the target rotational speed is reached.

Acceleration ramp 2: This ramp is characterized by a non-linear, force-independent acceleration. As with acceleration ramp 1, acceleration ends when the target rotational speed is reached and is not minimized by a specific time span. Again, the acceleration phase takes longer for large speed differences than for shorter ones. The difference lies in the fact that the acceleration is not constant, but is the same for all speed differences. For example, at the beginning and end of acceleration, the value of acceleration could be different, especially smaller. In a v/t diagram such a non-constant acceleration would represent a curve, while the constant acceleration from ramp 1 represents a straight line. The acceleration ends when the target rotational speed is reached.

Acceleration ramp 3: This ramp is characterized by a constant, force-independent acceleration (such as acceleration ramp 1), whereby the time span is additionally limited here. The limitation means that the target rotational speed must be reached within a certain time span, which means that the acceleration is constant, but the value of the acceleration depends on the speed difference. I.e. the acceleration varies depending on the desired difference, so that the target rotational speed can be reached within the adjustable time span.

Acceleration ramp 4: This ramp is characterized by a non-linear, force-independent acceleration (like acceleration ramp 2), whereby the time span is additionally limited here. The limitation means that the target rotational speed must be reached within a certain period of time, which means that the acceleration follows a given curve, but the value of the acceleration scales with the speed difference.

The acceleration ramps 5 to 8 correspond to the ramps 1 to 4, whereby the level of the force change is also taken into account.

Acceleration ramp 5: This ramp is characterized by a constant, force-dependent acceleration (similar to acceleration ramp 1). When a speed change is detected for the first time, the level of the force change is determined once and influences the constant acceleration. The value for the acceleration results from a parameterizable value and a factor that can also be parameterized, which specifies to what extent the force change is to influence the value for the acceleration. The acceleration ends when the target rotational speed is reached.

Acceleration ramp 6: This ramp is characterized by a non-linear, force-dependent acceleration (similar to acceleration ramp 2). The force change is continuously measured during the time span. The magnitude of the force change determines the current acceleration. The acceleration ends when the speed is reached.

Acceleration ramp 7: This ramp is characterized by a constant, force-dependent acceleration and a time limit. The limitation means that the target rotational speed should be reached within a certain period of time, which means that the acceleration is constant, but the value of the acceleration is dependent on the one hand on the speed difference and on the other hand on the magnitude of the force change, which is determined once when a speed change is detected for the first time. In combination, the magnitude of the force change and the speed difference define the constant acceleration during the time span (similar to acceleration ramp 3).

Acceleration ramp 8: This ramp is characterized by a non-linear, force-dependent acceleration and a time limit. During the time span of the ramp, the change in force is continuously measured and its magnitude determined. The force change together with the time limit determines the current acceleration. The acceleration phase ends when the speed or the maximum time span is reached.

The invention claimed is:

1. A manual operating element for operating an electrically adjustable piece of furniture, the manual operating element comprising
   a handle body comprising a mounting body, a handle section connected to the mounting body, and an elastic member operatively connected to the handle section, wherein the mounting body is adapted for attachment to a component of the piece of furniture, and wherein the handle section is adapted for gripping by a user;
   a force sensor for sensing a directional force value corresponding to a force applied to the handle section, the force sensor being operatively connected to the elastic member;
   a touch sensor for detecting a touch value as a function of a user touching the handle section; and
   a communication unit arranged to transmit the force value and the touch value and/or a signal derived from the force value and the touch value to a controller of the piece of furniture.

2. The manual operating element according to claim 1, wherein the touch sensor comprises at least one of the following:
   a capacitive sensor;
   a microswitch;
   a piezo switch;
   a sensor based on active materials;
   a sensor based on active polymers.

3. The manual operating element according to claim 1, wherein the touch sensor comprises a capacitive sensor, wherein the handle section and/or the elastic member are formed with a conductive material and form an electrode of the capacitive sensor.

4. The manual operating element according to claim 1, wherein the force sensor comprises a strain gauge and/or an electroactive polymer applied to the elastic member.

5. The manual operating element according to claim 4, wherein the elastic member is formed by a solid body having at least one cavity arranged under an outer surface of the handle body, the force sensor being mounted on the solid body in the vicinity of the cavity.

6. The manual operating element according to claim 4, wherein the handle section is formed elastically and includes the elastic member wherein the force sensor is attached to the elastic member.

7. The manual operating element according to claim 6, wherein the handle section forms an integral member with the elastic member and comprises two parallel or substantially parallel handle section parts each connected to the mounting body and adapted to clampably grip the component of the furniture piece together with the mounting body.

8. The manual operating element according to claim 4, wherein the handle section is rigid and elastically connected to the mounting body, wherein the elastic member extends between and is contained by the handle section and the mounting body, wherein the force sensor is attached to the elastic member.

9. The manual operating element according to claim 8, wherein the force sensor is arranged predominantly or completely within the mounting body.

10. The manual operating element according to claim 4, wherein the mounting body and the handle section are connected to one another via an elongate, rigid connecting body, wherein the connecting body is on one side rigidly or substantially rigidly connected to the handle section and on another side rotatably mounted at a fixed pivot point in the mounting body, and wherein the elastic member elastically couples the connecting body to the mounting body.

11. The manual operating element according to claim 1, wherein the force sensor comprises at least one pressure sensor, which is applied or integrated on or in an outside or surface of the handle section.

12. The manual operating element according to claim 11, wherein the handle body is formed with a rigid part comprising the mounting body and the handle section, and the elastic member is formed by a body of the pressure sensor.

13. The manual operating element according to claim 1, further comprising a control panel having at least one operating element or at least one button.

14. The manual operating element according to claim 13, wherein the control panel is mounted at a rigid location on the manual operating element or on the mounting body, or on or in the handle section.

15. A control system for operating an electrically adjustable piece of furniture, the control system comprising a manual operating element according to claim 1 and the controller which has a communication link to the manual operating element and is arranged to generate a drive signal for at least one adjustment drive of the piece of furniture based on the force value and the touch value.

16. The control system according to claim 15, wherein the controller is arranged to initiate and/or maintain an adjustment of the adjusting drive as a function of the touch value with the drive signal and to set an adjustment speed of the adjusting drive as a function of the force value.

17. The control system according to claim 16, wherein the controller is arranged to use the drive signal to further adjust the adjusting speed of the adjusting drive as a function of a duration of a force acting on the handle section and/or a duration of contact with the handle section.

18. The control system according to claim 16, wherein the controller is arranged to use the drive signal to set the displacement speed of the displacement drive as a function of the force value weighted by a first factor and a force integral value weighted by a second factor, the force integral value being based on a time integral of the force value.

19. The control system according to claim 18, wherein the controller is arranged to determine the force integral value based on a temporal progression of the force value and on at least one preceding force integral value.

20. The control system according to claim 15, wherein the controller is arranged to continuously decrease an adjustment speed of the adjusting drive to zero if the touch value indicates that the user is not touching the handle section.

21. The control system according to claim 15, wherein the controller is arranged to adapt an adjustment speed of the adjusting drive from a first speed value to a second speed value based on an acceleration ramp.

22. An electrically adjustable piece of furniture having a control system according to claim 15, comprising at least one adjusting drive.

23. The piece of furniture according to claim 19, wherein the piece of furniture is a table, a bed, a seat or a couch.

24. A method of operating an electrically adjustable piece of furniture comprising a manual operating element having a force sensor for sensing a directional force value corresponding to an acting force and a touch sensor for sensing a touch value in response to a user touching the manual operating element, the method comprising:
- transmitting the force value and the touch value to a controller of the piece of furniture; and
- generating, in the controller, a drive signal for at least one adjusting drive of the piece of furniture based on the force value and the touch value.

25. The method according to claim 24, further comprising,
- initiating and/or maintaining an adjustment of the adjusting drive with the drive signal as a function of the touch value; and
- Setting an adjustment speed of the adjusting drive with the drive signal as a function of the force value.

26. The method according to claim 25, wherein the adjustment speed of the adjustment drive is further set with the drive signal as a function of a duration of a force acting on the handle section and/or a duration of contact with the handle section.

27. The method according to claim 24, wherein an adjustment speed of the adjusting drive is continuously decreased to zero if the touch value indicates that the user is not touching the manual operating element.

28. The method according to claim 25, wherein the adjusting speed of the adjusting drive is set with the drive signal as a function of the force value weighted with a first factor and a force integral value weighted with a second factor, the force integral value being based on a time integral of the force value.

29. The method according to claim 28, wherein the force integral value is determined based on a time characteristic of the force value and on at least one preceding force integral value.

* * * * *